(12) United States Patent
Kim et al.

(10) Patent No.: US 8,742,420 B2
(45) Date of Patent: Jun. 3, 2014

(54) GATE DRIVING CIRCUIT, DISPLAY SUBSTRATE HAVING THE SAME AND METHOD OF MANUFACTURING THE DISPLAY SUBSTRATE

(75) Inventors: Ji-Sun Kim, Seoul (KR); Yeong-Keun Kwon, Yongin-si (KR); Chong-Chul Chai, Soul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 27 days.

(21) Appl. No.: 13/487,544

(22) Filed: Jun. 4, 2012

(65) Prior Publication Data

US 2013/0056736 A1 Mar. 7, 2013

(30) Foreign Application Priority Data

Sep. 1, 2011 (KR) .................. 10-2011-0088413

(51) Int. Cl.
*H01L 29/12* (2006.01)

(52) U.S. Cl.
USPC ............... 257/71; 257/59; 257/68; 257/296; 257/298; 257/E27.1; 257/E29.273

(58) Field of Classification Search
USPC ............... 257/59, 68, 71, 296, 298, E27.1, 257/E29.273; 505/192
See application file for complete search history.

(56) References Cited

U.S. PATENT DOCUMENTS 7,642,587 B2 1/2010 Kim

FOREIGN PATENT DOCUMENTS

| KR | 0600848 | 7/2006 |
|---|---|---|
| KR | 1020080062542 | 7/2008 |
| KR | 0920340 | 9/2009 |

*Primary Examiner* — Thanh V Pham
(74) *Attorney, Agent, or Firm* — F. Chau & Associates, LLC

(57) ABSTRACT

A gate driving circuit includes a plurality of stages outputting gate signals to a plurality of gate lines. Each of the stages includes a circuit transistor, a capacitor part, a first connecting electrode and a second connecting electrode. The circuit transistor outputs the gate signal to an output electrode in response to a control signal inputted to a control electrode. The capacitor part is disposed adjacent to the circuit transistor, and includes a first electrode, a second electrode disposed over the first electrode, a third electrode disposed over the second electrode and a fourth electrode disposed over the third electrode. The first connecting electrode electrically connects the control electrode to the first and third electrodes. The second connecting electrode electrically connects the output electrode to the second and fourth electrodes.

13 Claims, 14 Drawing Sheets

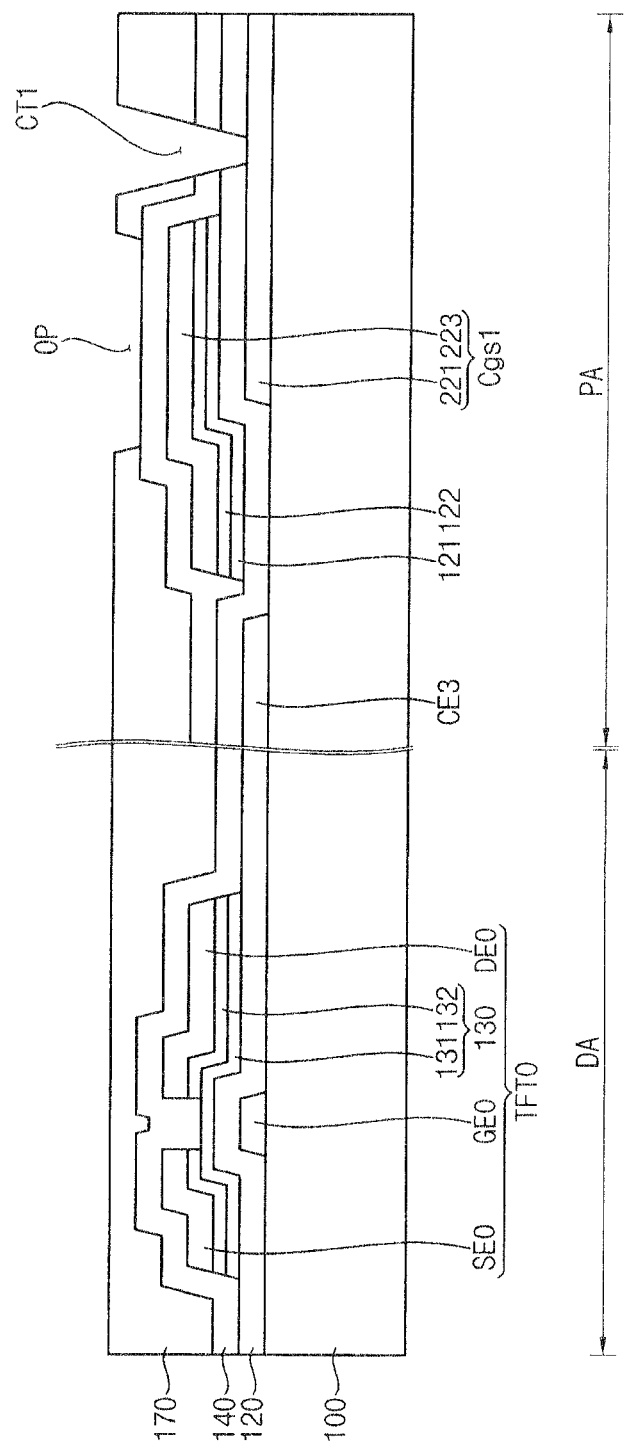

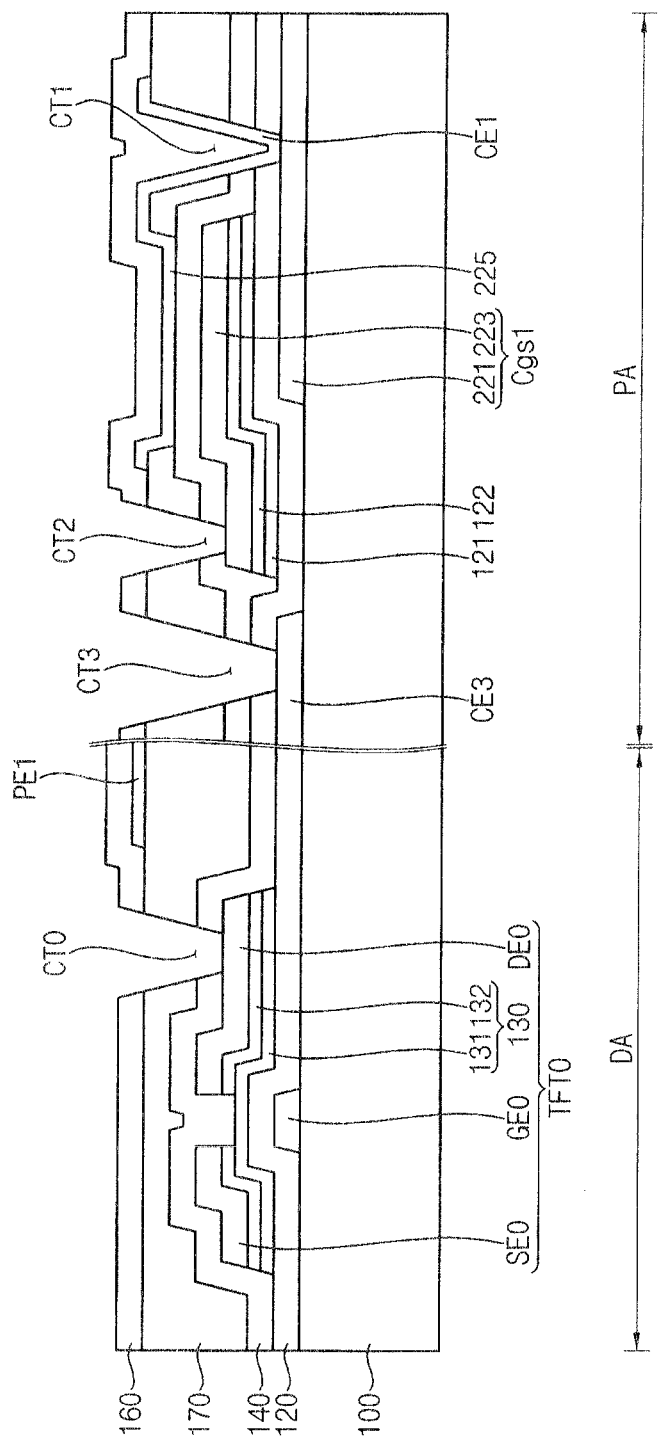

GATE DRIVING CIRCUIT, DISPLAY SUBSTRATE HAVING THE SAME AND METHOD OF MANUFACTURING THE DISPLAY SUBSTRATE

RELATED APPLICATIONS

This application claims priority under 35 U.S.C. §119 to Korean Patent Application No. 10-2011-0088413, filed on Sep. 1, 2011 in the Korean Intellectual Property Office (KIPO), the contents of which is herein incorporated by reference in its entirety.

1. Technical Field

Example embodiments of the present invention relate to a gate driving circuit, a display substrate having the gate driving circuit and a method of manufacturing the display substrate. More particularly, example embodiments of the present invention relate to a gate driving circuit mounted on a substrate, a display substrate having the gate driving circuit and a method of manufacturing the display substrate.

2. Description of the Prior Art

Generally, a liquid crystal display panel includes a first display substrate, a second display substrate facing the first display substrate, and a liquid crystal layer disposed between the first display substrate and the second display substrate. The first display substrate includes a display area in which a plurality of lines and a plurality of transistors connected to the lines are formed and a peripheral area in which pads applying an electrical signal to the lines are formed.

A liquid crystal display apparatus includes the liquid crystal display panel including a plurality of pixel parts formed by a plurality of gate lines and a plurality of data lines crossing the gate lines, a gate driving circuit outputting gate lines to the gate lines, and a data driving circuit outputting data signals to the data lines.

The gate driving circuit and a transistor are formed on the first display substrate at the same time, to reduce the total size of the liquid crystal display substrate and increase productivity.

SUMMARY

Example embodiments of the present invention provide a gate driving circuit reducing the bezel size of a display apparatus.

Example embodiments of the present invention provide a display substrate including the gate driving circuit having a reduced bezel size.

Example embodiments of the present invention provide a method of manufacturing a display substrate for a display apparatus.

According to an example embodiment of the present invention, a gate driving circuit includes a plurality of stages outputting gate signals to a plurality of gate lines. Each of the stages includes a circuit transistor, a capacitor part, a first connecting electrode and a second connecting electrode. The circuit transistor outputs the gate signal to an output electrode in response to a control signal inputted to a control electrode. The capacitor part is disposed adjacent to the circuit transistor, and includes a first electrode, a second electrode disposed over the first electrode, a third electrode disposed over the second electrode and a fourth electrode disposed over the third electrode. The first connecting electrode electrically connects the control electrode to the first and third electrodes. The second connecting electrode electrically connects the output electrode to the second and fourth electrodes.

In an example embodiment, the first connecting electrode may extend from the third electrode, and electrically connect the first electrode to the third electrode via a first contact hole exposing the first electrode.

In an example embodiment, the second connecting electrode may extend from the fourth electrode, and electrically connect the second electrode to the fourth electrode via a second contact hole exposing the second electrode.

In an example embodiment, the first electrode may include a material that is substantially the same as the control electrode. The second electrode may include a material that is substantially the same as the output electrode. Each of the third and fourth electrodes may include a transparent conductive oxide.

In an example embodiment, the gate driving circuit may further include a gate insulating film, a first passivation film and a second passivation film. The gate insulating film may be disposed between the first electrode and the second electrode. The first passivation film may be disposed between the second electrode and the third electrode. The second passivation film may be disposed between the third electrode and the fourth electrode.

In an example embodiment, the capacitor part includes a first capacitor, a second capacitor and a third capacitor. The first capacitor may include the first electrode, the second electrode and the gate insulating film between the first electrode and the second electrode. The second capacitor may include the third electrode, the fourth electrode and the second passivation film between the third electrode and the fourth electrode. The third capacitor may include the second electrode, the third electrode and the first passivation film between the second electrode and the third electrode.

In an example embodiment, the gate driving circuit may further include an organic film disposed between the first passivation film and the third electrode. The capacitor part includes a first capacitor, a second capacitor and a third capacitor. The first capacitor may include the first electrode, the second electrode and the gate insulating film between the first electrode and the second electrode. The second capacitor may include the third electrode, the fourth electrode and the second passivation film between the third electrode and the fourth electrode. The third capacitor may include the second electrode, the third electrode and the first passivation film and the organic film between the second electrode and the third electrode.

In an example embodiment, the gate driving circuit may further include a third connecting electrode disposed adjacent to the first electrode, including a material substantially same as the first electrode, and be electrically connected to the second connecting electrode.

According to an example embodiment of the present invention, a display substrate includes a base substrate, a pixel part and a gate driving circuit. The base substrate includes a display area and a peripheral area surrounding the display area. The pixel part is disposed in the display area, and includes a pixel transistor connected to gate and data lines crossing each other, a first pixel electrode insulated from the pixel transistor and a second pixel electrode connected to the pixel transistor and disposed over the first pixel electrode. The gate driving circuit is disposed in the peripheral area, and includes a plurality of stages outputting gate signals to gate lines. Each of the stages includes a circuit transistor, a capacitor part, a first connecting electrode and a second connecting electrode. The circuit transistor outputs the gate signal to an output electrode in response to a control signal inputted to a control electrode. The capacitor part is disposed adjacent to the circuit transistor, and including a first electrode, a second electrode disposed over the first electrode, a third electrode disposed over the second electrode and a fourth electrode disposed over the third electrode. The first connecting electrode electrically connects the control electrode to the first and third electrodes. The second connecting electrode electrically connects the output electrode to the second and fourth electrodes.

In an example embodiment, the first electrode may include a material that is substantially the same as the gate line and the control electrode. The second electrode may include a material that is substantially the same as the data line and the output electrode. The third electrode may include a material that is substantially the same as the first pixel electrode. The fourth electrode may include a material that is substantially the same as the second pixel electrode.

In an example embodiment, the first connecting electrode may extend from the third electrode, and electrically connect the first electrode to the third electrode via a first contact hole exposing the first electrode.

In an example embodiment, the second connecting electrode may extend from the fourth electrode, and electrically connect the second electrode to the fourth electrode via a second contact hole exposing the second electrode.

In an example embodiment, the display substrate may further include a third connecting electrode extending from the gate line, disposed adjacent to the first electrode, and electrically connected to the second connecting electrode.

According to an example embodiment of the present invention, a method of manufacturing a display substrate is provided. In the method, a gate pattern including a gate line and a first control electrode of a pixel transistor extending from the gate line in a display area of a base substrate and a second control electrode of a circuit transistor and a first electrode of a capacitor part extending from the second control electrode in a peripheral area of the base substrate is formed. A data pattern including a data line crossing the gate line and a first output/input electrode of the pixel transistor in the display area of the base substrate on which the gate pattern is formed and a second output/input electrode of the circuit transistor and a second electrode of the capacitor part extending from the second electrode in the peripheral area of the base substrate is formed. A first transparent electrode pattern including a first pixel electrode in the display area of the base substrate on which the data pattern is formed and a third electrode of the capacitor part and a first connecting electrode electrically connecting the first electrode to the third electrode in the peripheral area of the base substrate is formed. A second transparent electrode pattern including a second pixel electrode overlapping with the first pixel electrode in the display area of the base substrate on which the first transparent electrode pattern is formed and a fourth electrode of the capacitor part and a second connecting electrode electrically connecting the second electrode to the fourth electrode in the peripheral area of the base substrate is formed.

In an example embodiment, in the method, a gate insulating film and a data metal layer may be formed on the base substrate on which the gate pattern is formed, and the data metal layer may be patterned before forming the data pattern.

In an example embodiment, in the method, a first passivation film and an organic film may be sequentially formed on the base substrate on which the data pattern is formed, the gate insulating film, the first passivation film and the organic film may be removed, and the first electrode may be partially exposed, before forming the first transparent electrode pattern. When the first transparent electrode pattern is formed, the third electrode overlapping with the second electrode on the organic film and the first connecting electrode extending from the third electrode and electrically connected to the exposed first electrode may be formed.

In an example embodiment, in the method, the organic film may be removed, and the first passivation film corresponding to the capacitor part may be exposed. When the third electrode and the first connecting electrode are formed, the third electrode may be formed on the exposed first passivation film. The first connecting electrode extending from the third electrode on the organic film and electrically connected to the exposed first electrode may be formed.

In an example embodiment, in the method, a second passivation film may be formed on the base substrate on which the second transparent pattern is formed, the first passivation film, the organic film and the second passivation film may be partially removed, and the second electrode may be partially exposed, before forming the second transparent electrode pattern. When the second transparent electrode pattern is formed, the fourth electrode overlapping with the third electrode on the second passivation film and the second connecting electrode extending from the fourth electrode and electrically connected to the second electrode may be formed.

In an example embodiment, when the gate pattern is formed, a third connecting electrode extending from the gate line on the peripheral area of the base substrate and disposed adjacent to the first electrode may be formed.

In an example embodiment, in the method, a second passivation film may be formed on the base substrate on which the second transparent electrode pattern, the gate insulating film, the first passivation film, the organic film and the second passivation film may be partially removed, and the third connecting electrode may be partially exposed, before forming the second transparent electrode pattern. When the second transparent electrode pattern is formed, the fourth electrode overlapping with the third electrode on the second passivation film and the second connecting electrode extending from the fourth electrode and electrically connected to exposed third connecting electrode may be formed.

According to an example embodiment, a gate driving circuit, a display substrate having the gate driving circuit and a method of manufacturing the display substrate, first, second, third and fourth electrodes of a capacitor part of a gate driving circuit form a plurality of capacitors connected in parallel, so that an integrated area of the gate driving circuit may be reduced. Thus, the bezel size of the display apparatus may be reduced.

BRIEF DESCRIPTION OF THE DRAWINGS

The above and other features of embodiments of the present invention will become more apparent from the following descriptions thereof with reference to the accompanying drawings, in which:

FIGS. 9A to 9C are cross-sectional views illustrating a method of manufacturing the display substrate of FIG. 8.

DETAILED DESCRIPTION

Hereinafter, embodiments of the present invention will be explained in detail with reference to the accompanying drawings.

Figure 1:
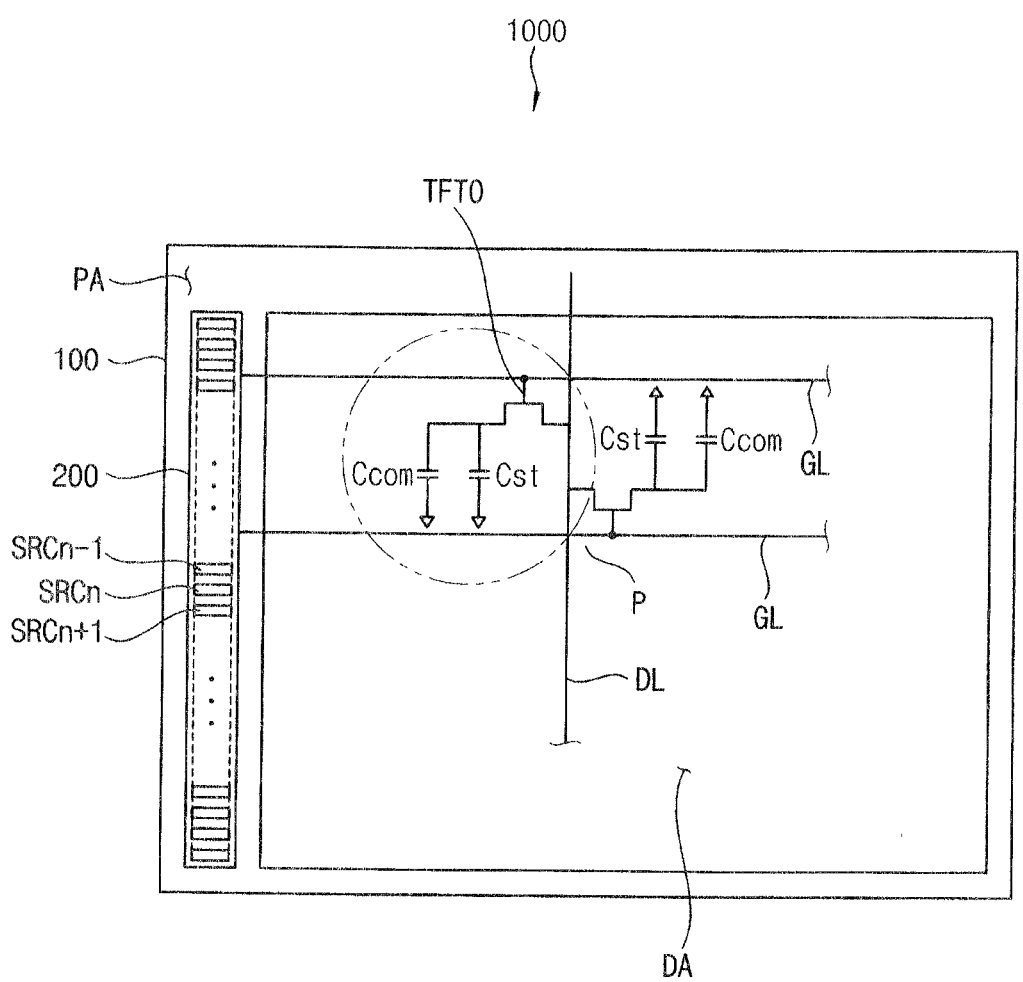
FIG. 1 is a plan view illustrating a display substrate according to an example embodiment of the present invention.

FIG. 1 is a plan view illustrating a display substrate according to an example embodiment of the present invention.

Referring to FIG. 1, a display substrate 1000 includes a base substrate 100 including a display area DA and a peripheral area PA surrounding the display area DA, a pixel part P disposed in the display area DA, and a gate driving circuit 200 formed in the peripheral area PA.

The pixel part P includes a pixel transistor TFT0 electrically connected to gate lines GL and data lines DL, a common capacitor Ccom electrically connected to the pixel transistor TFT0, and a storage capacitor Cst connected to the common capacitor Ccom in parallel.

The gate driving circuit 200 includes a shift register sequentially outputting gate signals having high levels respectively to the gate lines GL. The shift register includes a plurality of stages SRCn−1, SRCn, SRCn+1 ('n' is a natural number). The gate driving circuit 200 is mounted in the peripheral area PA located in and corresponding to an end of each of the gate lines GL.

Alternatively, the gate driving circuit 200 may be mounted in the peripheral area PA located in and corresponding to both ends of each of the gate lines GL.

Figure 2:
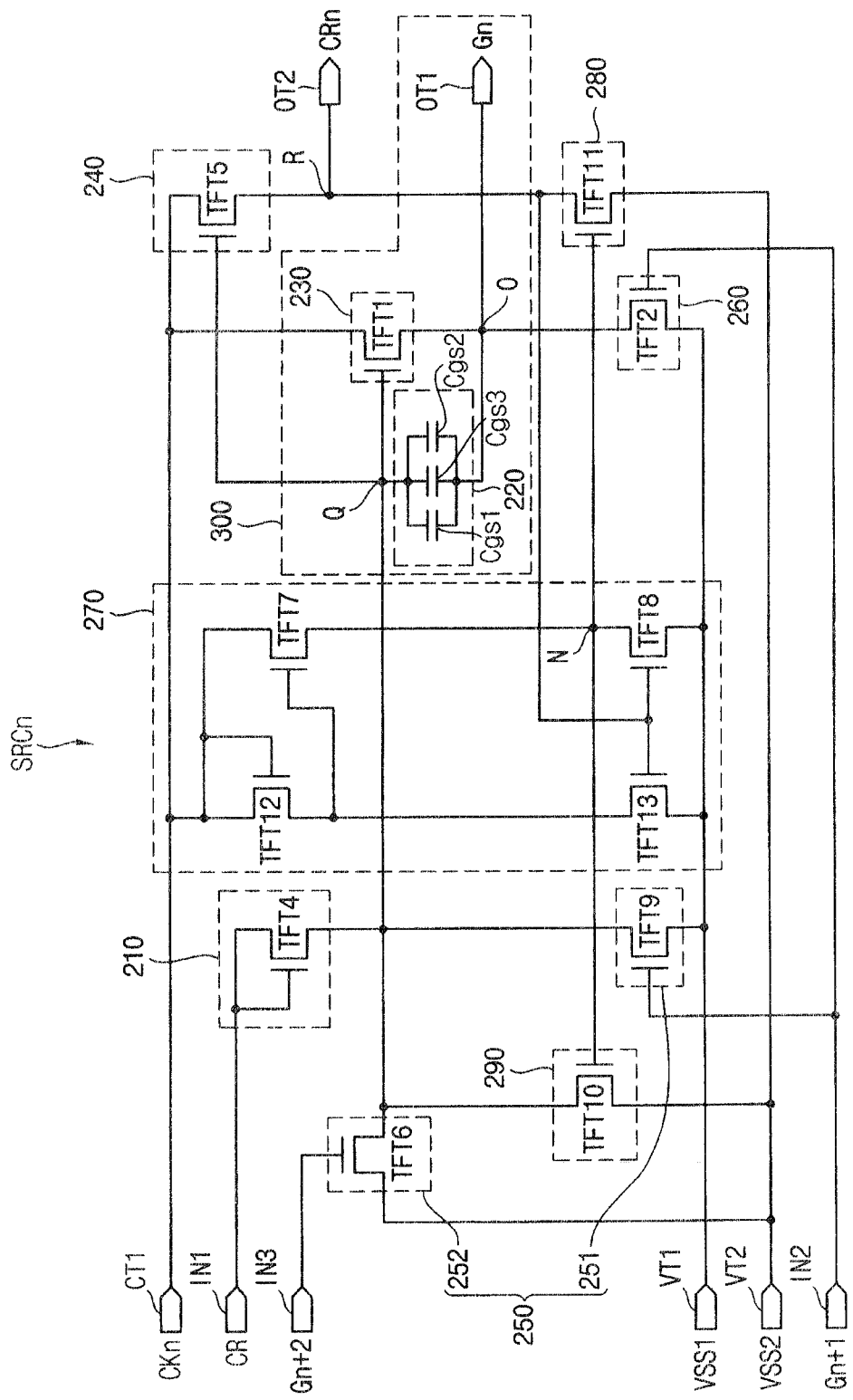
FIG. 2 is an equivalent circuit diagram for a stage of FIG. 1.

FIG. 2 is an equivalent circuit diagram for a stage of FIG. 1.

Referring to FIG. 2, an n-th stage SRCn includes a buffer part 210, a capacitor part 220, a pull-up part 230, a carry part 240, a discharge part 250, a pull-down part 260, a switching part 270, a first maintaining part 280 and a second maintaining part 290.

The buffer part 210 provides a carry signal or a vertical start signal of one of previous stages to the pull-up part 230. Hereinafter, in an example embodiment the buffer part 210 provides an (n−1)-th carry signal of an (n−1)-th stage to the pull-up part 230. The buffer part 210 may include a fourth transistor TFT4. For example, the pull-up part 230 may receive the (n−1)-th carry signal CRn−1.

The capacitor part 220 is charged in response to the carry signal CRn−1 provided from the buffer part 210. The capacitor part 220 is disposed between a control electrode of the pull-up part 230 and an output electrode of the pull-up part 230.

The capacitor part 220 includes a first capacitor Cgs1 and a second capacitor Cgs2 connected to the first capacitor Cgs1 in parallel. A first end of the first capacitor Cgs1 and a first end of the second capacitor Cgs2 are commonly connected to a Q node, and a second end of the first capacitor Cgs1 and a second end of the second capacitor Cgs2 are commonly connected to an output node O outputting a gate signal.

In addition, the capacitor part 220 may further include a third capacitor Cgs3 connected to the first and second capacitors Cgs1 and Cgs2 in parallel. A first end of the third capacitor Cgs3 is commonly connected to the Q node Q, and a second end of the third capacitor Cgs3 is commonly connected to the output node O.

When the buffer part 210 receives a high voltage of the (n−1)-th carry signal CRn−1, the capacitor part 220 is charged with a first voltage V1 corresponding to the high voltage. The first capacitor Cgs1 has a first capacitance formed between the first electrode and the second electrode formed over the first electrode, and the second capacitor Cgs2 has a second capacitance formed between the third electrode and the fourth electrode formed over the third electrode.

The third capacitor Cgs3 has a third capacitance formed between the second electrode and the third electrode over the second electrode. The third capacitance is smaller than each of the first and second capacitances, so that the third capacitance may be negligible.

The first capacitor Cgs1 is connected to the second capacitor Cgs2 in parallel, so that an area, in which the capacitor part 220 is disposed, may be reduced. Alternatively, the first capacitor Cgs1 is connected to the second capacitor Cgs2 and the third capacitor Cgs3 in parallel, so that the area, in which the capacitor part 220 is disposed, may be reduced.

For example, when the capacitor part 220 includes a single capacitor, the capacitor part 220 may occupy about 20 percent (%) of the integrated area of the gate driving circuit 200.

However, in an example embodiment, when the capacitor part 220 includes the first, the second and the third capacitors Cgs1, Cgs2 and Cgs3 connected in parallel, the capacitor part 220 may occupy about 6.25 percent of the integrated area of the gate driving circuit 200. Thus, about 15 percent of the integrated area of the gate driving circuit 200 may be reduced.

The pull-up part 230 outputs the gate signal. The pull-up part 230 may include a first transistor TFT1. The first transistor TFT1 includes a gate electrode (hereinafter, a control electrode) connected to the Q node, a drain electrode (hereinafter, an input electrode) connected to the first clock terminal CT1 and a source electrode (hereinafter, an output electrode) connected to the output node O. The output node O is connected to the first output terminal OT1.

The Q node connected to the control electrode is electrically connected to the first electrode and the third electrode of the capacitor part 220, so that externally electric affect is blocked by the second electrode and the fourth electrode. Thus, the first transistor TFT1 may output a stable gate signal.

When the first voltage V1 charged to the capacitor part 220 is applied to the control electrode of the pull-up part 230, the first clock terminal CT1 receives a high voltage VDD of the clock signal CK, so that the pull-up part 230 is bootstrapped. Then, the Q node connected to the control electrode of the pull-up part 230 is boosted from the first voltage V1 to a boosting voltage VBT. For example, the Q node has the first voltage V1 in an (n−1)-th period, and has the boosting voltage VBT in an n-th period.

During the n-th period in which the boosting voltage VBT is applied to a control electrode of the pull-up part 230, the pull-up part 230 outputs a high voltage of the clock signal CK with a high voltage of an n-th gate signal Gn. The n-th gate signal Gn is outputted via the first output terminal OT1 connected to the output node O.

The pull-down part 260 pulls down a voltage of the output node O with the first low voltage VSS1 applied to the first voltage terminal VT1, when a gate signal of one stage of next stages is received to the second input terminal IN2. The pull-down part 260 may include a second transistor TFT2. For example, one stage of next stages may be an (n+1)-th stage, the (n+1) gate signal (Gn+1) may be received to the second input terminal IN2. In an example embodiment, the pull-down part 260 receives the (n+1)-th gate signal (Gn+1).

The carry part 240 outputs a high voltage VDD of the clock signal CK received to the first clock terminal CT1 with the n-th carry signal CRn, when a high voltage is applied to the Q node. The n-th carry signal CRn is outputted via the second output terminal OT2 connected to R node. The carry part 240 may include a fifth transistor TFT5.

The first maintaining part 280 maintains a voltage of the R node with the second low voltage VSS2 in response to a signal of the N node during a period except for an output period of the n-th carry signal CRn. The first maintaining part 280 may include an eleventh transistor TFT11.

The switching part 270 applies a signal having a phase substantially same as the clock signal CK received to the first clock terminal CT1 to the N node during a period excepting for an output period of the n-th carry signal (CRn). The switching part 270 may include a twelfth transistor TFT12, a seven transistor TFT7, a thirteen transistor TFT13 and an eighteen transistor TFT8.

The discharge part 250 discharges a high voltage of the Q node with the second low voltage VSS2 having a level lower than the first low voltage VSS1 in response to at least one carry signal of next stages. The discharge part 250 includes a first discharge part 251 including a ninth transistor TFT9 and a second discharge part 252 including a sixth transistor TFT6.

The first discharge part 251 discharges the voltage of the Q node with the first low voltage VSS1 applied to the first voltage terminal VT1, when the first discharge part 251 receives the (n+1)-th gate signal (Gn+1) from the second input terminal IN2.

The second discharge part 252 discharges the voltage of the Q node with the second low voltage VSS2 applied to the second voltage terminal VT2, when the (n+2)-th gate signal (Gn+2) is applied to the third input terminal IN3.

The second maintaining part 290 maintains the voltage of the Q node with the second low voltage VSS2 in response to a signal of the N node during a rest period of the frame. The second maintaining part 290 may include a tenth transistor TFT10.

The gate drive circuit and each stage are illustrated in FIG. 2 as an example. FIG. 2 may be applicable to a gate drive circuit including the pull-up part 230 and the capacitor part 220.

Figure 3:
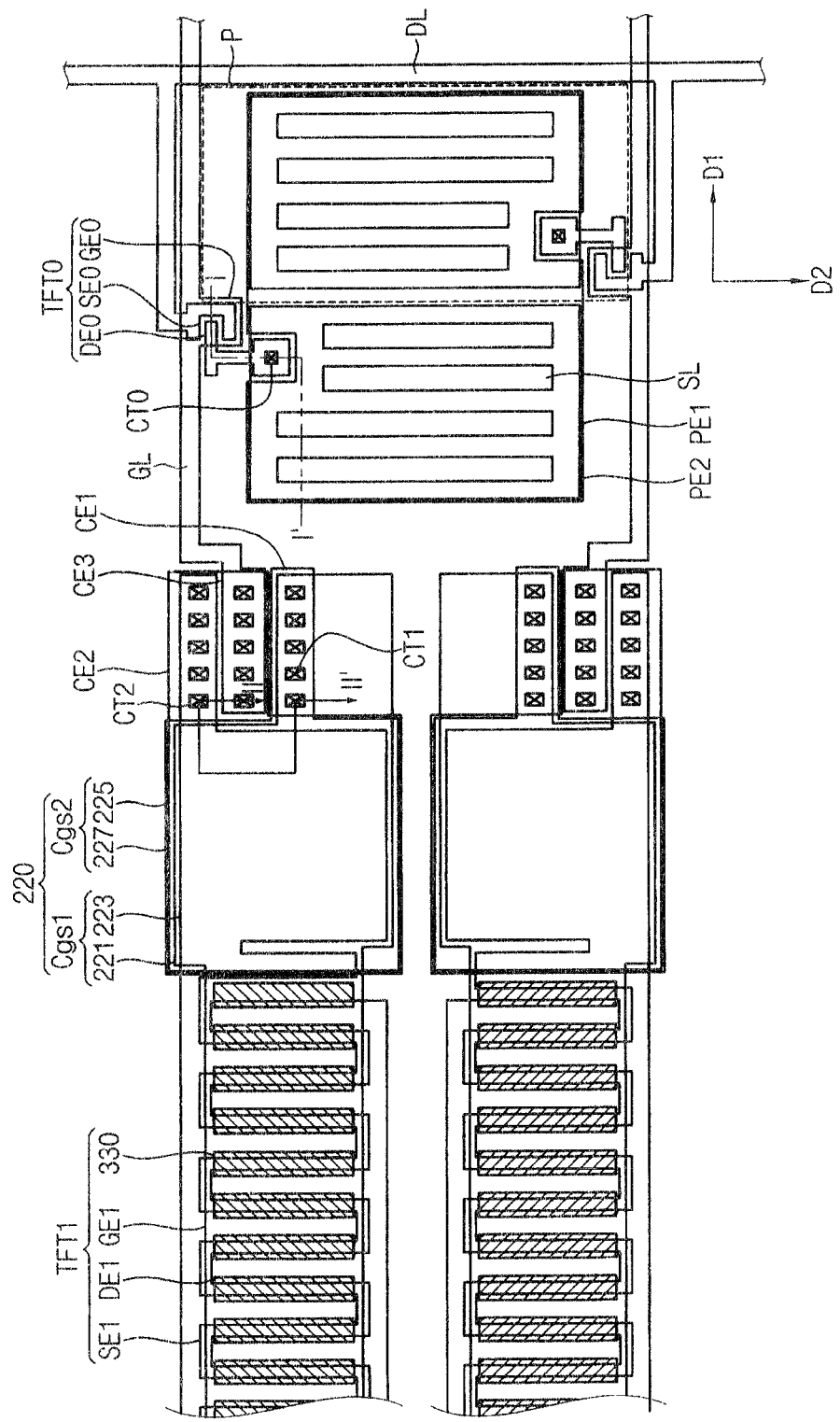
FIG. 3 is a plan view illustrating a pixel part and a gate driving circuit of the display substrate of FIG. 1.
Figure 4:
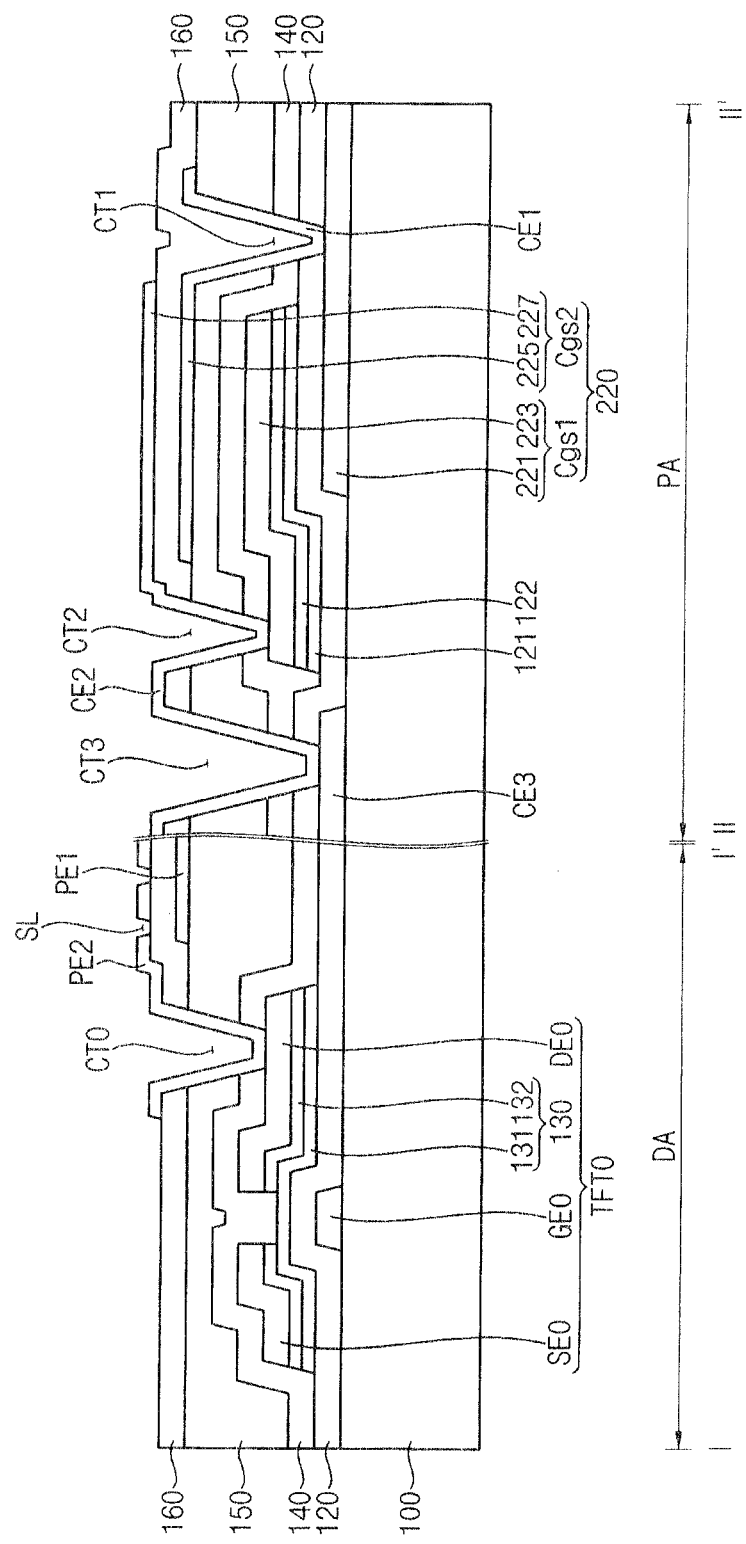
FIG. 4 is a cross-sectional view taken along a line I-I' and a line II-II' of FIG. 3.

FIG. 3 is a plan view illustrating a pixel part and a gate driving circuit of the display substrate of FIG. 1. FIG. 4 is a cross-sectional view taken along a line I-I' and a line II-II' of FIG. 3.

Referring to FIG. 3 and FIG. 4, the pixel part P disposed on the display area DA of the base substrate 100 may have a rectangular shape.

The pixel part P includes a gate line GL, a gate insulating film 120, a data line DL, a pixel transistor TFT0 electrically connected to the gate line GL and the data line DL, a first passivation film 140, an organic film 150, a first pixel electrode PE1, a second passivation film 160 and a second pixel electrode PE2.

The gate line GL extends in a first direction D1, and the data line DL extends in a second direction D2 crossing the first direction D1.

The pixel transistor TFT0 includes a gate electrode GE0 (hereinafter, a first control electrode), a channel layer 130, a source electrode SE0 (hereinafter, a first source electrode) and a drain electrode DE0 (hereinafter, a first input electrode).

The first control electrode GE0 extends from the gate line GL, and includes a gate metal substantially same as the gate line GL.

The gate insulating film 120 is formed on the base substrate 100 to cover a gate pattern including the first control electrode GE0 and the gate line GL. The gate insulating film 120 may include a silicon nitride (SiNx). The gate insulating film 120 may have a thickness between about 3500 Å and about 4500 Å.

The channel layer 130 is formed on the gate insulating film 120 corresponding to the first control electrode GE0. The channel part 130 includes an activating layer 131 and an ohmic contact layer 132.

For example, the activating layer 131 may include amorphous silicon (a-Si), and the ohmic contact layer 132 may include n+ amorphous silicon (n+a-Si) highly doped with n-type impurity. The ohmic contact layer 132 is formed in areas in which the ohmic contact layer 132 overlaps with the first output electrode SE0 and the first input electrode DE0.

The first output electrode SE0 extends from the data line DL, and includes a data metal substantially same as the data line DL. The first output electrode SE0 is formed on the channel layer 130 corresponding to the first control electrode GE0.

The first input electrode DE0 is spaced apart from the first output electrode SE0, and includes the substantially same data metal as the data line DL. The first input electrode DE0 is electrically connected to the second pixel electrode PE2. The first input electrode DE0 is formed on the channel layer 130 corresponding to the first control electrode DE0.

The first passivation film 140 is formed on the gate insulating film 120 to cover a data pattern including the first output electrode SE0, the first input electrode DE0 and the data line DL. The first passivation film 140 partially exposes the first input electrode DE0. The first passivation film 140 may have a thickness of about 1000 Å.

The organic film 150 is formed on the passivation film 140, so that the organic 150 planarizes a surface of the display substrate, and decreases a parasitic capacitance between the data pattern and the first pixel electrode PE1 or the second pixel electrode PE2. The organic film 150 partially exposes the first input electrode DE0. The organic film 150 may have a thickness of about 2 μm.

The first pixel electrode PE1 is formed on the organic film 150. The first pixel electrode PE1 may include transparent conductive oxide (TCO). For example, the TCO may be indium tin oxide (ITO) or indium zinc oxide (IZO). The first pixel electrode PE1 is disposed in an area defined by the gate line GL and the data line DL, so that the first pixel electrode PE1 may not overlap with the gate line GL and the data line DL. Alternatively, the first pixel electrode PE1 is disposed in the area defined by the gate line GL and the data line DL, so that the first pixel electrode PE1 may overlap with the gate line GL or the data line DL.

The first pixel electrode PE1 may receive a common voltage from a common line (not shown) separately formed from the gate line GL and the data line DL.

The second passivation film 160 is formed on the organic film 150 to cover the first pixel electrode PE1. The second passivation film 160 partially exposes the first input electrode DE0. The second passivation film 160 may have a thickness substantially same as or less than about 2000 Å. For example, the second passivation film 160 may have a thickness between about 1000 Å and about 2000 Å.

The second pixel electrode PE2 is formed on the second passivation film 160, so that the second pixel electrode PE2 overlaps with the first pixel electrode PE1. The second pixel electrode PE2 is electrically connected to the first input electrode DE0 through a pixel contact hole CT0 formed through the first passivation film 140, the organic film 150 and the second passivation film 160. The second pixel electrode PE2 includes a plurality of slits SL. The slits SL extend in the second direction D2, and expose the second passivation film 160. The second pixel electrode PE2 may include the TCO. For example, the TCO may include ITO, IZO, or etc.

The second pixel electrode PE2 is disposed in an area defined by the gate line GL and the data line DL, so that the second pixel electrode PE2 may not overlap with the gate line GL and the data line DL. Alternatively, the second pixel electrode PE2 is disposed in the area defined by the gate line GL and the data line DL, so that the second pixel electrode PE2 may overlap with the gate line GL or the data line DL.

Alternatively, the pixel part P may have a "V"-shape. The data line DL corresponding to the pixel part P is bent to have the "V"-shape. Each of The first pixel electrode PE1, the second pixel electrode PE2 and the slit SL of the second pixel electrode PE2 may have the "V"-shape.

Each stage of the gate driving circuit 200 formed in the peripheral area PA of the base substrate 100 includes a first transistor TFT1, a capacitor part 220, a first connecting electrode CE1, a second connecting electrode CE2 and a third connecting electrode CE3.

The first transistor TFT1 includes a second control electrode GE1, a channel part 330, a second output electrode SE1 and a second input electrode DE1.

As described in FIG. 2, the control electrode GE1 of the first transistor TFT1 is connected to Q node to receive a high voltage of the clock signal CK. The first transistor TFT1 outputs the gate signal Gn via the output electrode SE1 in response to the high voltage of the clock signal CK.

The second control electrode GE1 of the first transistor TFT1 may include the gate metal. The second control electrode GE1 of the first transistor TFT1 and the gate line are formed at the same time.

The gate insulating film 120 is formed on the base substrate 100 to cover the second control electrode GE1.

The second output electrode SE1 and the second input electrode DE1 of the first transistor TFT1 include the data metal. The second output electrode SE1 and the second input electrode DE1 of the first transistor TFT1 and the data line DL may be formed at the same time.

The channel part 330 may be disposed under the second output electrode SE1 and the second input electrode DE1 of the first transistor TFT1. The channel part 330 includes an activating layer and an ohmic contact layer. For example, the activating layer may include amorphous silicon (a-Si), and the activating layer of the channel part 330 and the activating layer 131 of the pixel transistor TFT0 may be formed at the same time. The ohmic contact layer may include n+ amorphous silicon (n+a-Si) highly doped with n-type impurity, and be formed at the same time when the ohmic contact layer 132 of the pixel transistor TFT0 is formed.

The capacitor part 220 is formed adjacent to the first transistor TFT1, and is disposed between the first transistor TFT1 and the pixel part P.

The capacitor part 220 includes a first electrode 221, a second electrode 223, a third electrode 225 and a fourth electrode 227.

The first electrode 221 is disposed on the base substrate 100, and extends from a second control electrode GE1 of the first transistor TFT1. The first electrode 221 and the gate line GL are formed at the same time.

The gate insulating film 120 is formed on the base substrate 100 to cover the first electrode 221. The gate insulating film 120 partially exposes the first electrode 221.

The second electrode 223 is formed on the base substrate 100 on which the gate insulating film 120 is formed. The second electrode 223 may include the data metal, and be formed at the same time when the data line DL is formed. For example, as shown in FIG. 4, first and second active patterns 121 and 122 in addition to the gate insulating film 120 may be disposed between the first electrode 221 and the second electrode 223. Alternatively, the first and second active patterns 121 and 122 between the first electrode 221 and the second electrode 223 may be omitted.

The first electrode 221, the second electrode 223 and the gate insulating film 120 between the first electrode 221 and the second electrode 223 form the first capacitor Cgs1. This first capacitor Cgs1 has a first capacitance.

The first passivation film 140 is formed on the gate insulating film 120 to cover the second electrode 223. The organic film 150 is formed on the first passivation film 140. The gate insulating film 120, the first passivation film 140 and the organic film 150 are patterned, so that a first contact hole CT1 partially exposing the first electrode 221 is formed. The organic film 150 may have a thickness of about 2 μm.

The third electrode 225 may be formed on the organic film 150, and the third electrode 225 and the first pixel electrode PE1 may be formed at the same time. The third electrode 225 is electrically connected to the first electrode 221 exposed through the first contact hole CT1. The third electrode 225 may include transparent conductive oxide (TCO), and the TCO may include iridium tin oxide (ITO) and indium zinc oxide (IZO).

The second passivation film 160 is formed on the organic film 150 to cover the third electrode 225. The second passivation film 160 may have a thickness of about 2000 Å. For example, the second passivation film 160 may have a thickness between about 1000 Å and about 2000 Å.

The fourth electrode 227 may be formed on the second passivation film 160, and the fourth electrode 227 and the second pixel electrode PE2 may be formed at the same time.

The third electrode 225, the fourth electrode 227 and the second passivation film 160 between the third electrode 225 and the fourth electrode 227 form the second capacitor Cgs2. Thus, the second capacitor Cgs2 has a second capacitance.

Alternatively, the second electrode 223, the third electrode 225, and the first passivation film 140 and the organic film 150 between the second electrode 223 and the third electrode 225 may further form the third capacitor Cgs3. The third capacitor Cgs3 has a third capacitance. The third capacitance is smaller than each of the first and second capacitances due to a thickness of the first passivation film 140 and the organic film 150 disposed between the second electrode 223 and the third electrode 225, and thus the third capacitance may be negligible.

The first connecting electrode CE1 electrically connects the first electrode 221 to the third electrode 225. The first connecting electrode CE1 extends from the third electrode 225. The first connecting electrode CE1 is electrically connected to the first electrode 221 via the first contact hole CT1 which is formed through the gate insulating film 120, the first passivation film 140 and the organic film 150 and partially exposes the first electrode 221.

A signal applied to the second control electrode GE1 of the first transistor TFT1 is applied to the first electrode 221 of the first capacitor Cgs1 and the third electrode 225 of the second capacitor Cgs2 by the first connecting electrode CE1. The signal applied to the second control electrode GE1 of the first transistor TFT1 is a control signal controlling an outputting of the gate signal.

The second connecting electrode CE2 electrically connects the second electrode 223 to the fourth electrode 227. The second connecting electrode CE2 extends from the fourth electrode 227. The second connecting electrode CE2 is electrically connected to the second electrode 223 via the second contact hole CT2 which is formed through the first passivation film 140 and the organic film 150 and partially exposes the second electrode 223.

The third connecting electrode CE3 electrically connects a gate line GL in the display area DA to the second electrode 223 and the fourth electrode 227. The third connecting electrode CE3 extends from the gate line GL. The second connecting electrode CE2 is electrically connected to the third connecting electrode CE3 via the third contact hole CT3 which is formed through the gate insulating film 120, the first passivation film 140 and the organic film 150 and partially exposes the third connecting electrode CE3. Thus, the third connecting electrode CE3 is electrically connected to the second electrode 223 and the fourth electrode 227 electrically connected to the second electrode CE2.

A signal applied to the second output electrode SE1 of the first transistor TFT1 is applied to the second electrode 223 of the first capacitor Cgs1, the fourth electrode 227 of the second capacitor Cgs2 and the gate line GL through the second and third connecting electrodes CE2 and CE3. The signal applied to the second output electrode SE1 of the first transistor TFT1 is the gate signal. Thus, the gate signal is applied to the gate line GL via the second electrode 223 of the first capacitor Cgs1 and the fourth electrode 227 of the second capacitor Cgs2.

Figure 5A:
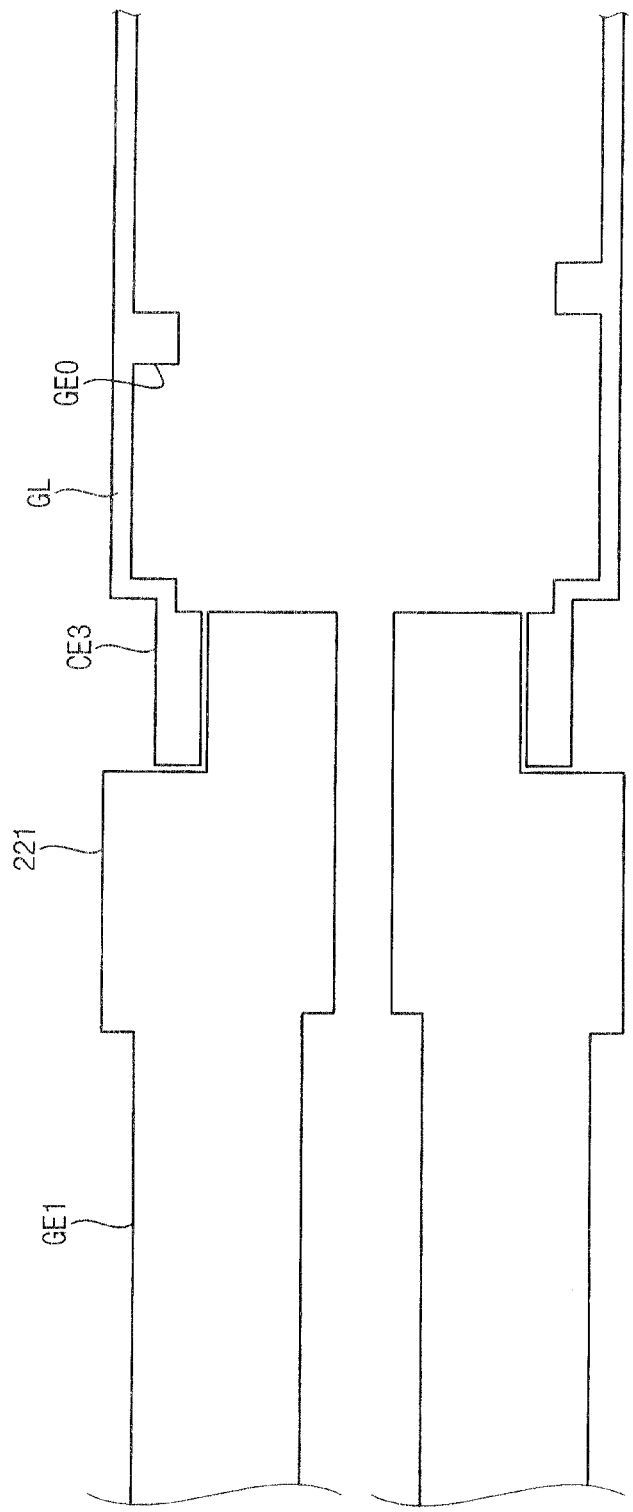
FIGS. 5A, 6A and 7A are plan views illustrating a method of manufacturing the display substrate of FIG. 1, and FIGS. 5B, 6B and 7B are cross-sectional views illustrating a method of manufacturing the display substrate of FIG. 1.
Figure 5B:
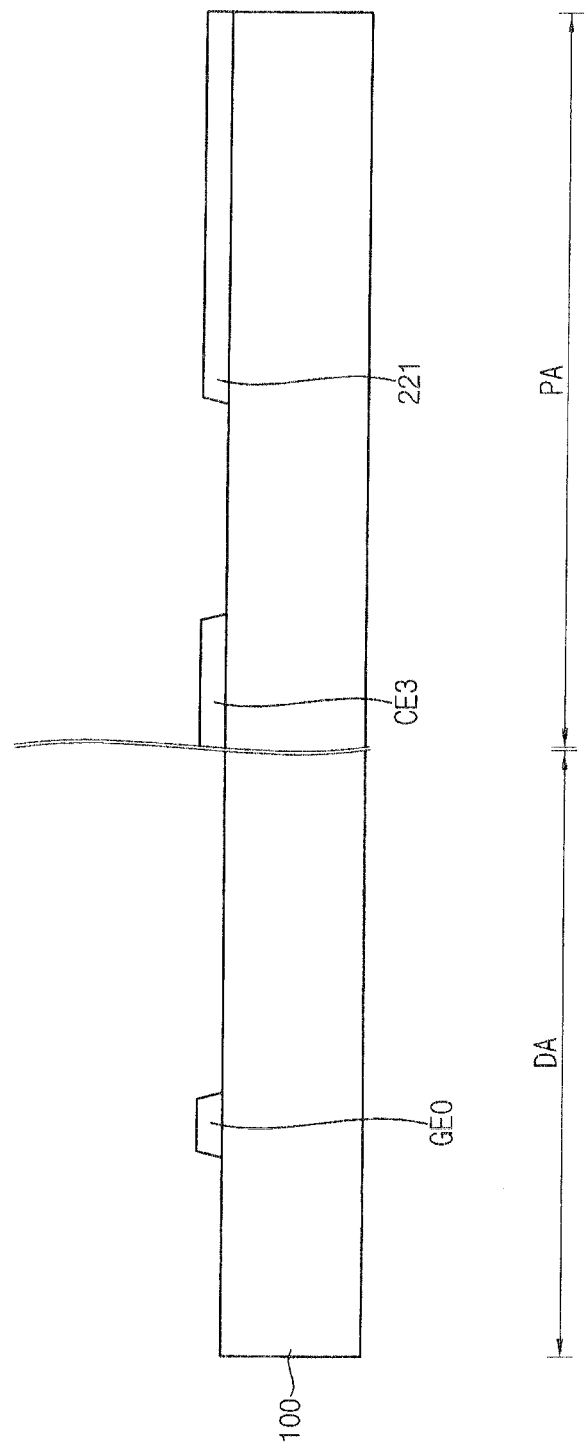
Figure 6A:
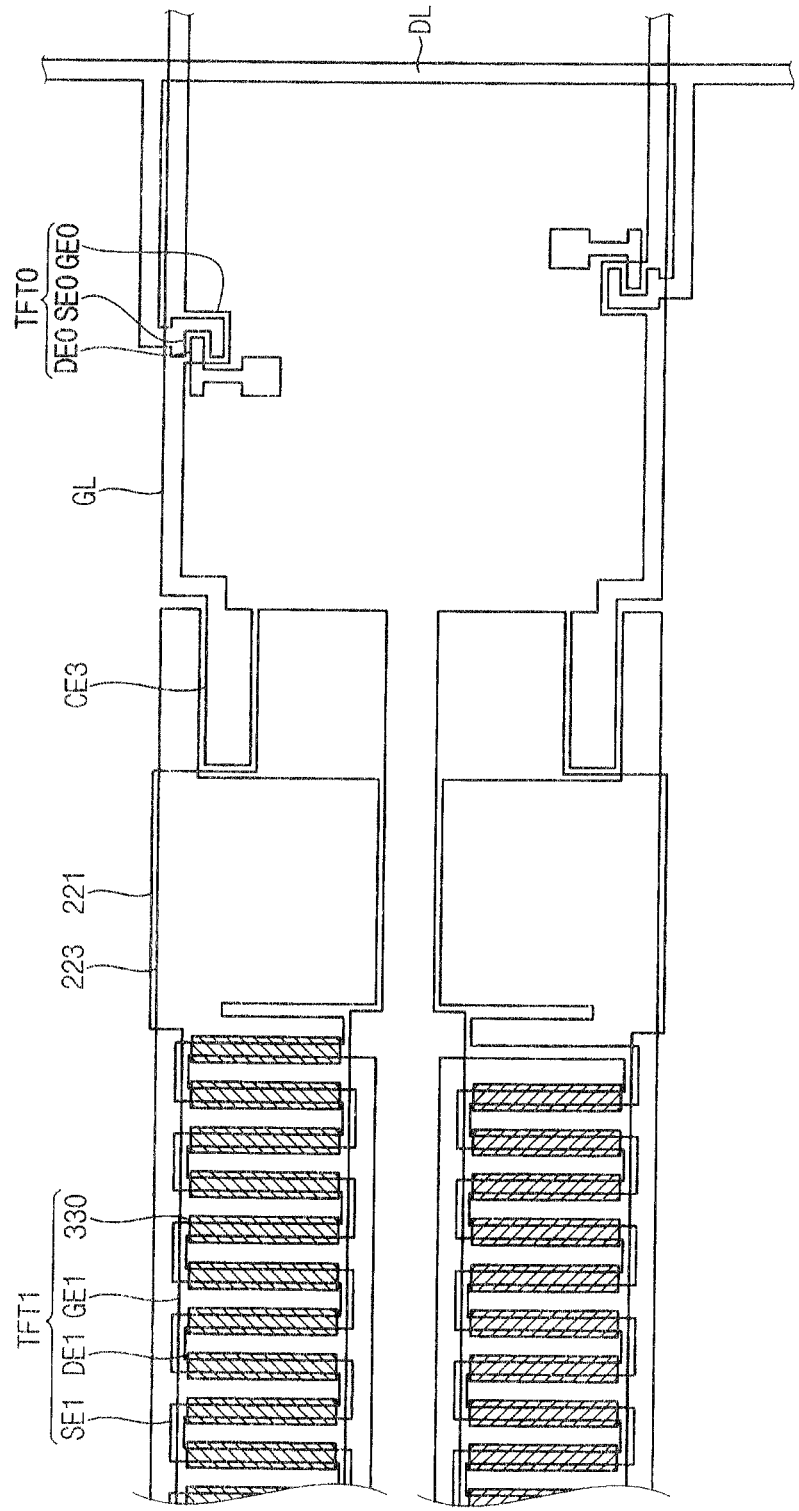
Figure 6B:
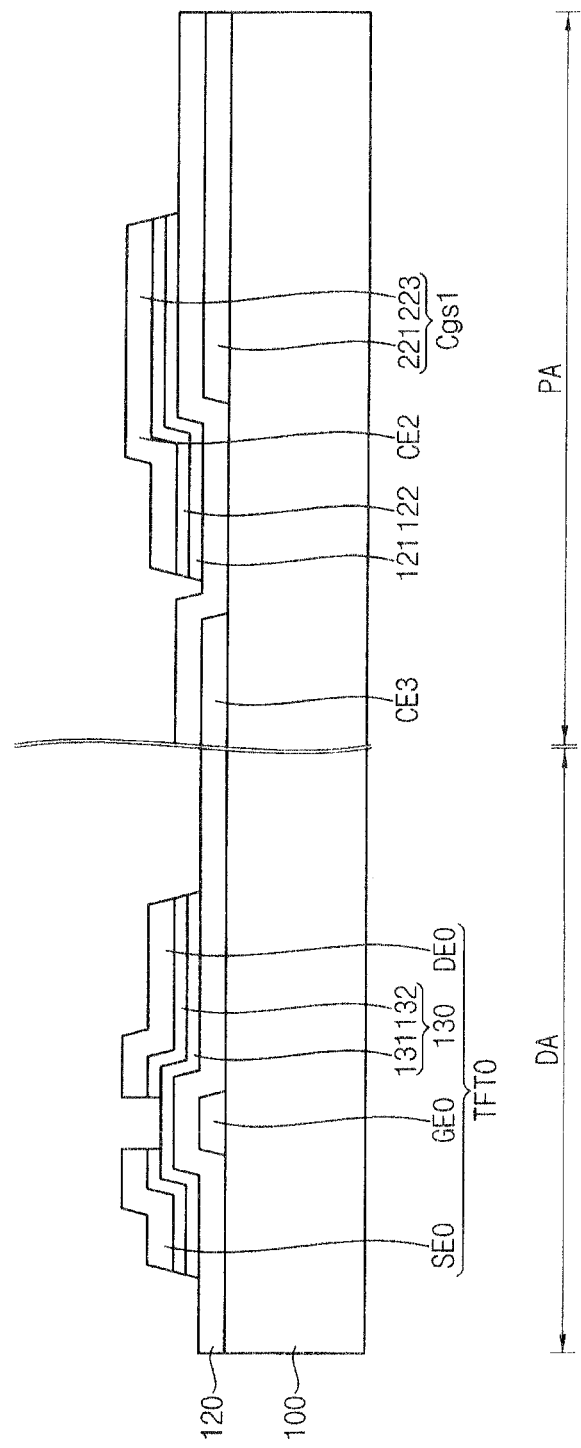
Figure 7A:
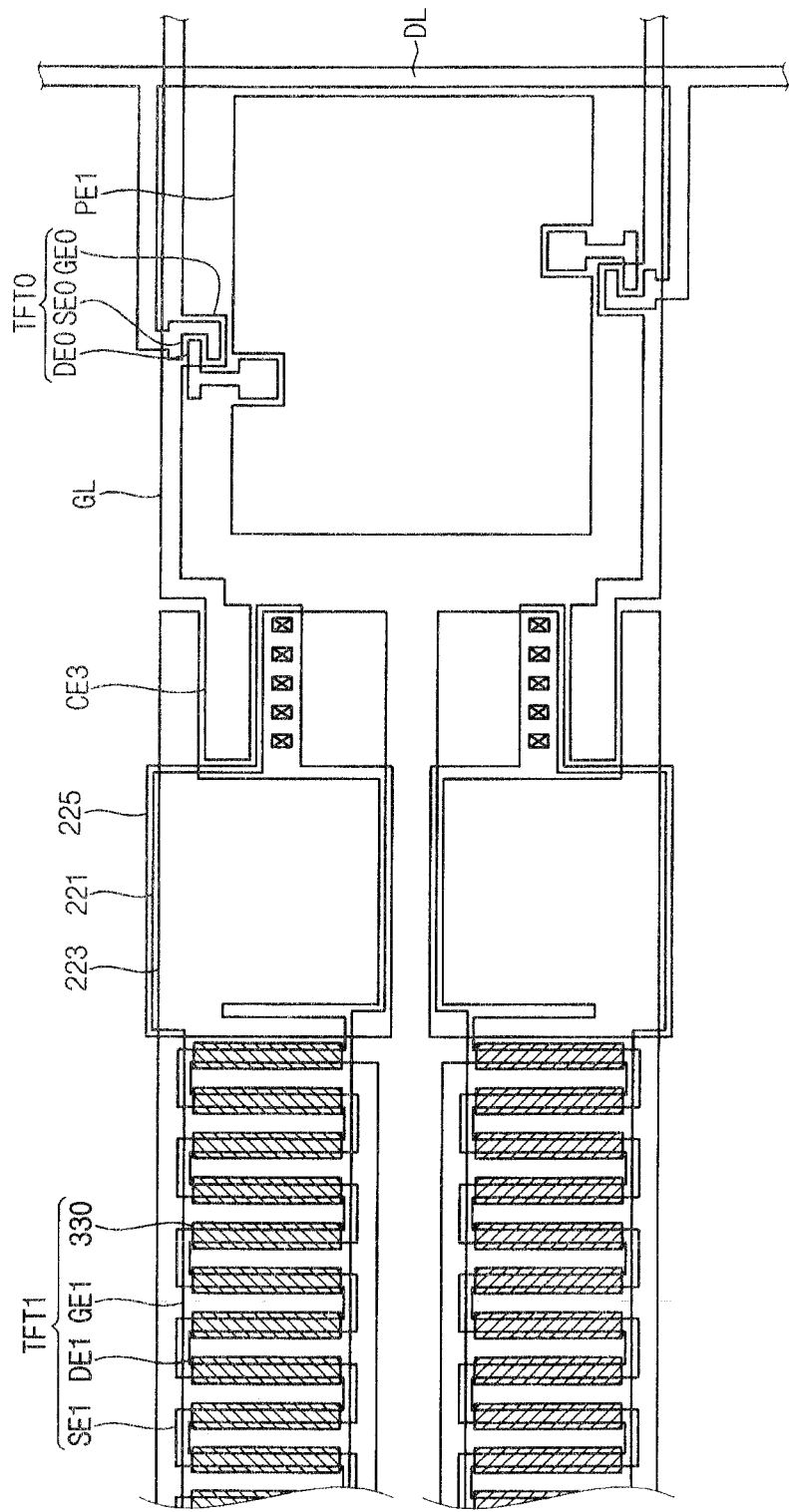

FIGS. 5A, 6A and 7A are plan views illustrating a method of manufacturing the display substrate of FIG. 1, and FIGS. 5B, 6B and 7B are cross-sectional views illustrating a method of manufacturing the display substrate of FIG. 1.

Referring to FIG. 5A and FIG. 5B, a gate metal layer is formed on the base substrate 100, and the gate metal layer is patterned, so that a gate pattern is formed. The gate pattern includes the gate line GL, the first control electrode GE0 of the pixel transistor TFT0 and the common line (not shown) in the display area DA, and the control electrode GE1 of the first transistor TFT1, the first electrode 221 of the capacitor part 220 and the third connecting electrode CE3 in the peripheral area PA.

For example, the gate metal layer is formed on the base substrate 100 using a metal deposition method such as a sputtering method, etc. Example of the gate metal layer may include a metal including molybdenum (Mo), titanium (Ti), copper (Cu), aluminium (Al), chrome (Cr), and the likes and an alloy thereof. The gate metal layer may be a single layer or a multi-layer. Then, the gate metal layer is patterned by a photo lithography process and an etching process using a first mask, so that the gate pattern is formed.

Referring to FIG. 6A and FIG. 6B, a gate insulating film 120 including silicon nitride (SiNx), amorphous silicon (a-Si:H) layer and n+ amorphous silicon (n+a-Si) layer highly doped with n-type impurity are sequentially formed on the base substrate 100 on which the gate pattern is formed, using a chemical vapor deposition (CVD) method, a plasma enhanced chemical vapor deposition (PECVD) method, or the like.

Then, a data metal layer is formed on an n+ amorphous silicon (n+a-Si) layer using the metal deposition method such as the sputtering method, or the like. Example of the data metal layer may be a metal such as chrome (Cr), aluminium (Al), tantalum (Ta), molybdenum (Mo), titanium (Ti), tungsten (W), copper (Cu), silver (Ag), or the like, or an alloy thereof. The data metal layer may be a single layer or a multi-layer.

Then, the data metal layer is patterned by the photo lithography process and the etching process using a second mask, so that the source pattern is formed. The source pattern includes the data line DL, the first output electrode SE0 of the pixel transistor TFT0 and the first input electrode DE0 of the pixel transistor TFT0 in the display area DA, and the second output electrode SE1 of the first transistor TFT1, the second input electrode DE1 of the first transistor TFT1 and the second electrode 223 of the capacitor part 220 in the peripheral area PA.

Thus, the first electrode 221, the second electrode 223, and the gate insulating film 120 between the first electrode 221 and the second electrode 223 form the first capacitor Cgs1.

The amorphous silicon (a-Si:H) layer and the n+ amorphous silicon (n+a-Si) layer are patterned, so that the active pattern is formed under the data pattern.

For example, the channel part 130 including the first activating layer 131 and the ohmic contact layer 132 is formed under the first output electrode SE0 and the first input electrode DE0 of the pixel transistor TFT0 in the display area DA. The channel part (330 in FIG. 3) including an activating layer and an ohmic contact layer is formed under the second output electrode SE1 and the second input electrode DE1 of the first transistor TFT1 in the peripheral area PA. In addition, the first and second active patterns 121 and 122 are formed under the second electrode 223 of the capacitor part 220 in the peripheral area PA. Alternatively, the first and second active patterns 121 and 122 may be removed by a separate process in the peripheral area PA.

Figure 7B:
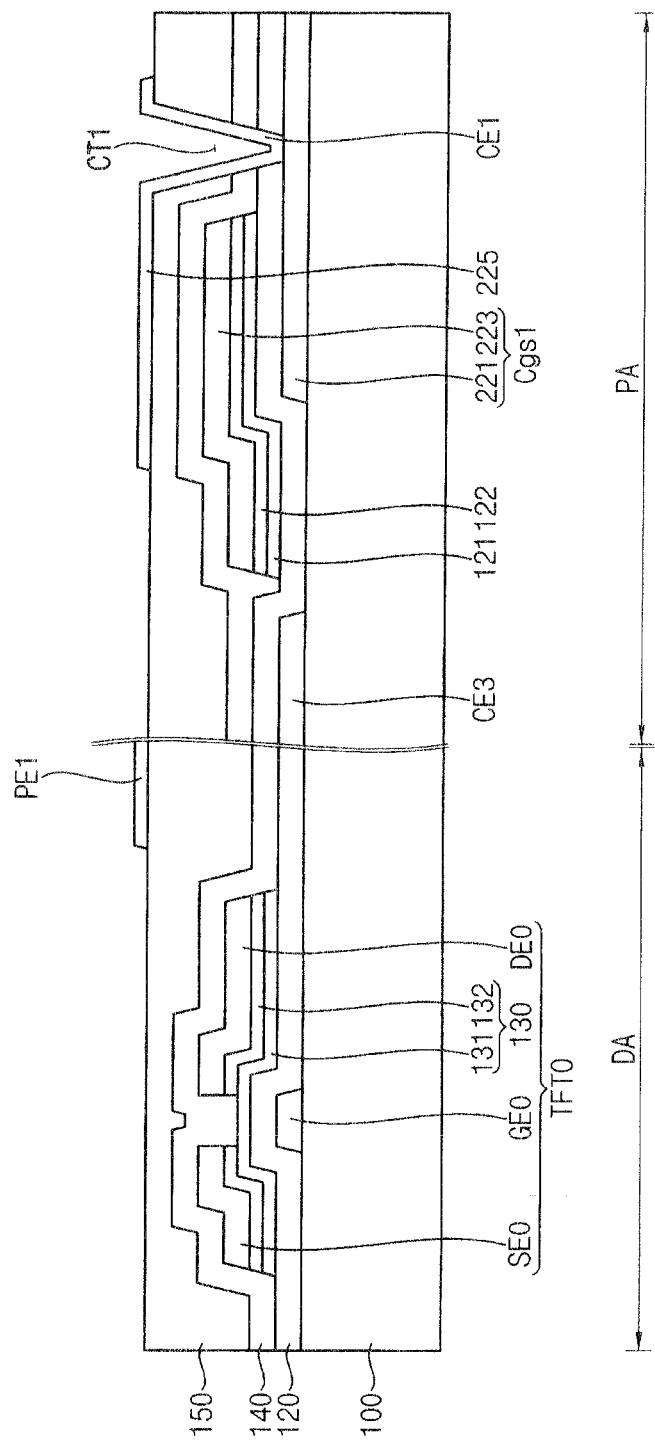

Referring to FIG. 7A and FIG. 7B, the first passivation film 140 and the organic film 150 are formed on the base substrate 110 on which the data pattern is formed, and then a hole is formed through the gate insulating layer 120, the first passivation film 140 and the organic film 150 by the photo lithography process using a third mask. For example, the first contact hole CT1 is formed to partially expose the first electrode 221 in the peripheral area PA.

Then, a first transparent electrode layer is formed on the organic film 150 through which the first contact hole CT1 is formed. The first transparent electrode layer may include transparent conductive oxide (TCO), and the TCO may include indium tin oxide (ITO) or indium zinc oxide (IZO). Then, a first transparent electrode layer is patterned using a fourth mask, so that a first transparent electrode pattern is formed. The first transparent electrode pattern includes a first pixel electrode PE1 in the display area DA, and the third electrode 225 of the capacitor part 220 and the first connecting electrode CE1 extending from the third electrode 225 in the peripheral area PA.

The first pixel electrode PE1 is electrically connected to the common line of the gate pattern to receive a voltage from the common line.

Then, the second electrode 223, the third electrode 225, and the first passivation film 140 and the organic film 150 between the second electrode 223 and the third electrode 225 may form the third capacitor Cgs3. However, the third capacitance of the third capacitor Cgs3 is small and may be negligible due to the thickness of the first passivation film 140 and the organic film 150.

In the peripheral area PA, the first connecting electrode CE1 is electrically connected to the first electrode 221 via the first contact hole CT1, and the first electrode 221 is electrically connected to the third electrode 225 by the first connecting electrode CE1.

Referring to FIG. 3 and FIG. 4 again, the second passivation film 160 is formed on the base substrate 100 on which the first transparent pattern is formed, and then a hole is formed through the gate insulating film 120, the first passivation film 140, the organic film 150 and the second passivation film 160 by the photo lithography process using a fifth mask.

For example, in the display area DA, the pixel contact hole CT0 is formed to partially expose the first input electrode DE0 of the pixel transistor TFT0. In addition, in the peripheral area PA, the second contact hole CT2 is formed to partially expose the second electrode 223 and the third contact hole CT3 is formed to partially expose the third connecting electrode CE3.

A second transparent electrode layer is formed on the second passivation film 160 through which the pixel contact hole CT0 in the display area DA and the second and third contact holes CT2 and CT3 in the peripheral area PA are formed. The second transparent layer may include transparent conductive oxide (TCO), and the TCO may include indium tin oxide (ITO) or indium zinc oxide (IZO). Then, the second transparent electrode layer is patterned using a sixth mask, so that the second transparent electrode pattern is formed. The second transparent electrode pattern includes the second pixel electrode PE2 in the display area DA, and the fourth electrode 227 of the capacitor part 220 and the second connecting electrode CE2 extending from the fourth electrode 227 in the peripheral area PA.

Thus, the third electrode 225, the fourth electrode 227, and the second passivation film 160 between the third electrode 225 and the fourth electrode 227 form the second capacitor Cgs2.

The first input electrode DE0 of the pixel transistor TFT0 is electrically connected to the second pixel electrode PE2 via the pixel contact hole CT0 in the display area DA. In addition, the second connecting electrode CE2 is electrically connected to the second electrode 223 via the second contact hole CT2, so that the second electrode 223 is electrically connected to the fourth electrode 227 in the peripheral area PA. In addition, the second connecting electrode CE2 is electrically connected to the third connecting electrode CE3 via the third contact hole CT3, so that the third connecting electrode CE3 is electrically connected to the fourth electrode 227 in the peripheral area PA.

According to an example embodiment, the gate driving circuit 200 includes a parallel-type capacitor part 220, so that an integrated area of the gate driving circuit 200 may be reduced.

Figure 8:
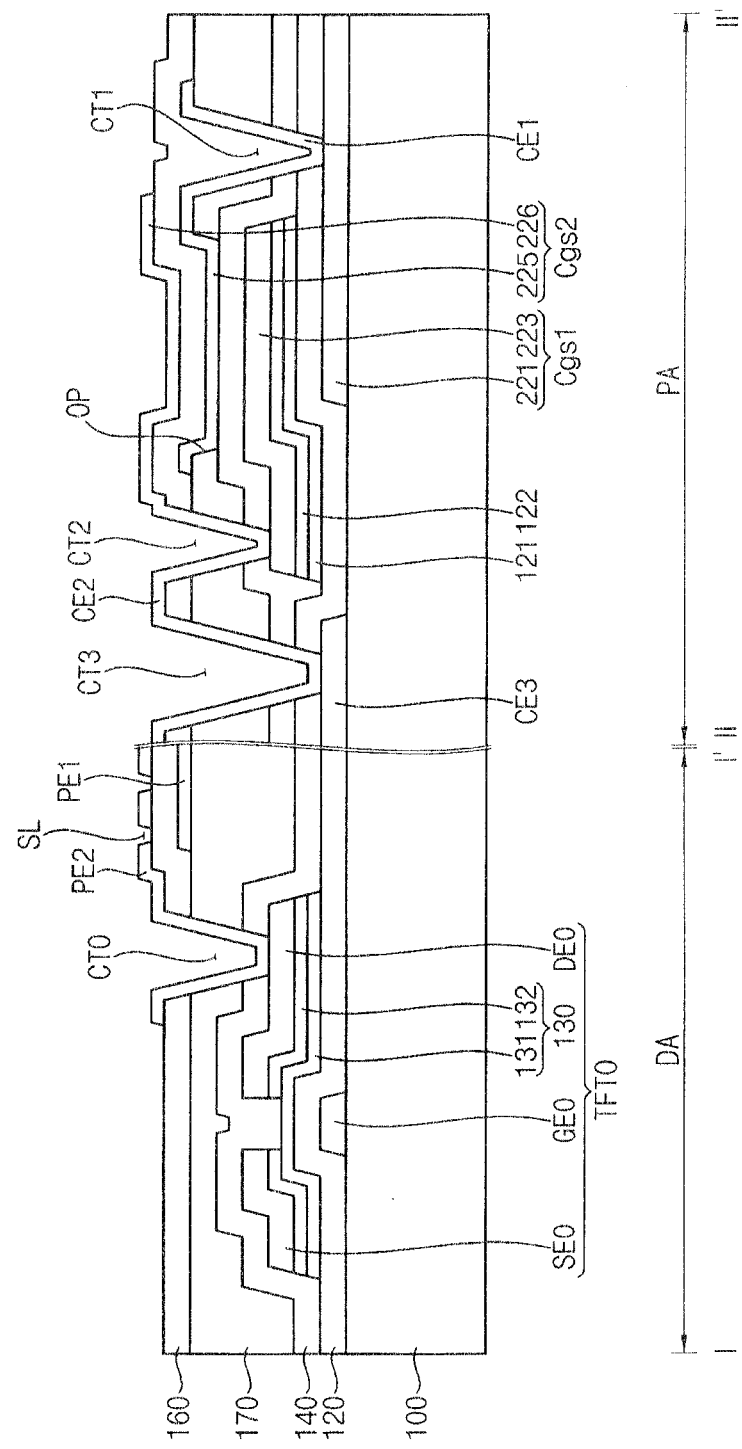
FIG. 8 is a cross-sectional view illustrating a display substrate according to an example embodiment of the present invention.

FIG. 8 is a cross-sectional view illustrating a display substrate according to an example embodiment of the present invention.

The display substrate according to an example embodiment as shown in FIG. 8 is substantially the same as a display substrate according to an example embodiment described in FIG. 1 except for the organic film. Thus, the same reference numerals will be used to refer to the same or like parts as those described in an example embodiment of FIG. 1 and any repetitive explanation concerning the above elements will be omitted.

Referring to FIG. 8, a pixel part P disposed in a display area DA of the base substrate 100 of a display substrate 2000 includes a gate line GL, a gate insulating layer 120, a data line DL, a pixel transistor TFT0 electrically connected to the gate line GL and the data line DL, a first passivation film 140, an organic film 170, a first pixel electrode PE1, a second passivation film 160 and a second pixel electrode PE2.

The organic film 170 is disposed on the first passivation film 140 in the display area DA of the display substrate 2000.

The organic film 170 planarizes a surface of the display area DA, and reduces a parasitic capacitance between the data pattern and the first pixel electrode PE1 or the second pixel electrode PE2. The organic 150 may have a thickness of about 2 μm.

Each stage of a gate driving circuit 200 disposed in a peripheral area PA of the base substrate 100 includes a first transistor TFT1, a capacitor part 220, a first connecting electrode CE1, a second connecting electrode CE2 and a third connecting electrode CE3.

The capacitor part 220 includes a first electrode 221, a second electrode 223, a third electrode 225 and a fourth electrode 227.

The organic film 170 is disposed on the first passivation film 140 in the peripheral area PA of the display substrate 2000. The organic film 170 has an opening OP partially exposing the first passivation film 140 corresponding to the capacitor part 220.

The third electrode 225 is disposed on the organic film 170 having the opening OP. The second electrode 223, the third electrode 225, and the first passivation film 140 between the second electrode 223 and the third electrode 225 form a third capacitor Cgs3. The third capacitor Cgs3 has a third capacitance. The organic film 170 corresponding to the capacitor part 220 is removed, so that the first passivation film 140 only exists between the second electrode 223 and the third electrode 225. Thus, the third capacitance is increased, so that an area of the capacitor part 220 may be further reduced. Alternatively, the organic film 170 corresponding to the capacitor part 220 is not entirely removed, but is only partially removed, so that the organic film 170 corresponding to the capacitor part 220 may have a lesser thickness than the thickness of the organic film 170 which does not correspond to the capacitor part 220.

Figure 9B:
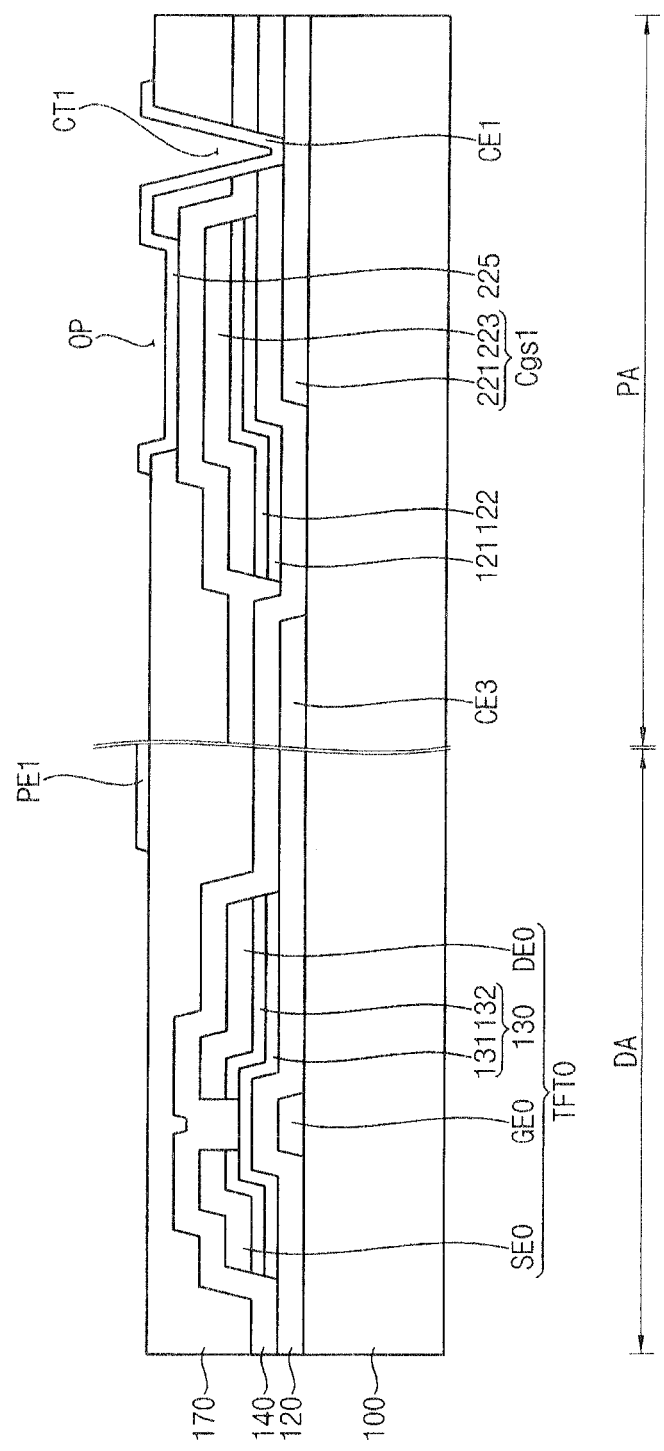

FIGS. 9A to 9C are cross-sectional views illustrating a method of manufacturing the display substrate of FIG. 8.

Referring to FIG. 9A, the first passivation film 140 and the organic film 170 are formed on the base substrate 100 on which a data pattern is formed. Then, a contact hole CT1 is formed to partially expose the first electrode 221 in the peripheral area PA by a photo lithography process using a third mask which is a haft-tone mask or a slit mask, and the opening OP is formed to partially expose the first passivation film 140 corresponding to the capacitor part 220.

For example, the first contact hole CT1 partially exposing the first electrode 221 is formed through the insulating film 120, the first passivation film 140 and the organic film 170 by the photo lithography process using the third mask. At the same time, the opening OP is formed to partially expose the first passivation film 140 in the organic film 170 corresponding to the capacitor part 220 by the photo lithography process using the third mask.

Referring to FIG. 9B, a first transparent electrode layer is formed on the organic film 170 through which the first contact hole CT1 and the opening OP are formed. The first transparent electrode layer may include transparent conductive oxide (TCO), and the TCO may include indium tin oxide (ITO) or indium zinc oxide (IZO).

The first transparent electrode layer is patterned using a fourth mask, so that the first electrode pattern is formed. The first transparent electrode pattern includes the first pixel electrode PE1 in the display area DA, and the third electrode 225 of the capacitor part 220 and the first connecting electrode CE1 extending from the third electrode 225 in the peripheral area PA.

Thus, the second electrode 223, the third electrode 225, and the first passivation film 140 between the second electrode 223 and the third electrode 225 form the third capacitor Cgs3.

Referring to FIG. 9C, the second passivation film 160 is formed on the base substrate 100 on which the first transparent electrode pattern is formed, and then holes are formed through the gate insulating film 120, the first passivation film 140, the organic film 170 and the second passivation film 160 by the photo lithography process using a fifth mask. For example, in the display area DA, the pixel contact hole CT0 is formed to partially expose the second input electrode DE0. In the peripheral area PA, the second contact hole CT2 is formed to partially expose the second electrode 223 and the third contact hole CT3 is formed to partially expose the third connecting electrode CE3.

Referring to FIG. 8 again, a second transparent electrode layer is formed on the second passivation film 160 through which the pixel contact hole CT0 is formed in the display area DA and the second and third contact holes CT2 and CT3 are formed in the peripheral area PA. The second transparent electrode layer may include transparent conductive oxide (TCO), and the TCO may include indium tin oxide (ITO) or indium zinc oxide (IZO). The second transparent electrode layer is patterned using a sixth mask, so that the second transparent electrode pattern is formed. The second transparent electrode pattern includes the second pixel electrode PE2 of the display area DA, and the fourth electrode 227 of the capacitor part 220 and the second connecting electrode CE2 extends from the fourth electrode 227 of the peripheral area PA.

Thus, the first input electrode DE0 of the pixel transistor TFT0 is electrically connected to the second pixel electrode PE2 via the pixel contact hole CT0 in the display area DA. The second connecting electrode CE2 is electrically connected to the second electrode 223 via the second contact hole CT2 in the peripheral area PA, so that the second electrode 223 is electrically connected to the fourth electrode 227. In addition, the second connecting electrode CE2 is electrically connected to the third connecting electrode CE3 via the third contact hole CT3 in the peripheral area PA, so that the third connecting electrode CE3 is electrically connected to the fourth electrode 227.

According to an example embodiment, the gate driving circuit 200 includes the third capacitor Cgs2, so that the integrated area of the gate driving circuit 200 may be further reduced.

According to an embodiment of the present invention, first, second, third and fourth electrodes of a capacitor part of a gate driving circuit form a plurality of capacitors connected in parallel, so that the integrated area of the gate driving circuit may be reduced. Thus, the bezel size of the display apparatus may be reduced.

The foregoing is illustrative of an embodiment of the present invention and is not to be construed as limiting thereof. Those skilled in the art will readily appreciate that many modifications are possible in the example embodiment without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A gate driving circuit comprising:
a plurality of stages outputting gate signals to a plurality of gate lines, each of the stages comprising:
  a circuit transistor configured to output the gate signal to an output electrode in response to a control signal inputted to a control electrode;
  a capacitor part disposed adjacent to the circuit transistor and including a first electrode, a second electrode disposed over the first electrode, a third electrode disposed over the second electrode and a fourth electrode disposed over the third electrode;
  a first connecting electrode electrically connecting the control electrode to the first and third electrodes; and
  a second connecting electrode electrically connecting the output electrode to the second and fourth electrodes.

2. The gate driving circuit of claim 1, wherein the first connecting electrode extends from the third electrode, and electrically connects the first electrode to the third electrode via a first contact hole exposing the first electrode.

3. The gate driving circuit of claim 1, wherein the second connecting electrode extends from the fourth electrode, and electrically connects the second electrode to the fourth electrode via a second contact hole exposing the second electrode.

4. The gate driving circuit of claim 1, wherein the first electrode includes a material substantially same as the control electrode,
the second electrode includes a material substantially same as the output electrode, and
each of the third and fourth electrodes includes a transparent conductive oxide.

5. The gate driving circuit of claim 1, further comprising:
a gate insulating film disposed between the first electrode and the second electrode;
a first passivation film disposed between the second electrode and the third electrode; and
a second passivation film disposed between the third electrode and the fourth electrode.

6. The gate driving circuit of claim 5, wherein the capacitor part comprises:
a first capacitor including the first electrode, the second electrode and the gate insulating film between the first electrode and the second electrode;
a second capacitor including the third electrode, the fourth electrode and the second passivation film between the third electrode and the fourth electrode; and
a third capacitor including the second electrode, the third electrode and the first passivation film between the second electrode and the third electrode.

7. The gate driving circuit of claim 5, further comprising an organic film disposed between the first passivation film and the third electrode,
wherein the capacitor part comprises:
a first capacitor including the first electrode, the second electrode and the gate insulating film between the first electrode and the second electrode;
a second capacitor including the third electrode, the fourth electrode and the second passivation film between the third electrode and the fourth electrode; and
a third capacitor including the second electrode, the third electrode, and the first passivation film and the organic film between the second electrode and the third electrode.

8. The gate driving circuit of claim 1, further comprising a third connecting electrode disposed adjacent to the first electrode, including a material substantially same as the first electrode, and electrically connected to the second connecting electrode.

9. A display substrate comprising:
a base substrate including a display area and a peripheral area surrounding the display area;
a pixel part disposed in the display area, and including a pixel transistor connected to gate and data lines crossing each other, a first pixel electrode insulated from the pixel transistor, and a second pixel electrode connected to the pixel transistor and disposed over the first pixel electrode; and
a gate driving circuit disposed in the peripheral area, and including a plurality of stages outputting gate signals to gate lines, each of the stages comprising:

a circuit transistor outputting the gate signal to an output electrode in response to a control signal inputted to a control electrode;

a capacitor part disposed adjacent to the circuit transistor, and including a first electrode, a second electrode disposed over the first electrode, a third electrode disposed over the second electrode and a fourth electrode disposed over the third electrode;

a first connecting electrode electrically connecting the control electrode to the first and third electrodes; and a second connecting electrode electrically connecting the output electrode to the second and fourth electrodes.

10. The display substrate claim 9, wherein the first electrode includes a material substantially the same as the gate line and the control electrode, the second electrode includes a material substantially the same as the data line and the output electrode, the third electrode includes a material substantially the same as the first pixel electrode, and the fourth electrode includes a material substantially the same as the second pixel electrode.

11. The display substrate claim 9, wherein the first connecting electrode extends from the third electrode, and electrically connects the first electrode to the third electrode via a first contact hole exposing the first electrode.

12. The display substrate claim 9, wherein the second connecting electrode extends from the fourth electrode, and electrically connects the second electrode to the fourth electrode via a second contact hole exposing the second electrode.

13. The display substrate claim 12, further comprising a third connecting electrode extending from the gate line, disposed adjacent to the first electrode, and electrically connected to the second connecting electrode.

* * * * *